United States Patent
Chen et al.

(10) Patent No.: US 10,154,731 B2
(45) Date of Patent: Dec. 18, 2018

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 15/653,905

(22) Filed: Jul. 19, 2017

(65) Prior Publication Data
US 2018/0140092 A1 May 24, 2018

(30) Foreign Application Priority Data
Nov. 22, 2016 (TW) .............................. 105138538 A

(51) Int. Cl.
*A47B 88/40* (2017.01)
*H05K 7/14* (2006.01)
(Continued)

(52) U.S. Cl.
CPC ............ *A47B 88/40* (2017.01); *A47B 88/487* (2017.01); *A47B 88/493* (2017.01); *H05K 7/1489* (2013.01); *A47B 88/427* (2017.01); *A47B 2210/004* (2013.01); *A47B 2210/0016* (2013.01); *A47B 2210/0018* (2013.01);
(Continued)

(58) Field of Classification Search
CPC ..... A47B 88/40; A47B 88/473; A47B 88/477; A47B 88/57; A47B 88/16; A47B 2210/0064; A47B 2210/0067; A47B 2210/007; A47B 2210/0097; A47B 2210/0032; A47B 2210/0035; A47B 2210/0051; A47B 2210/0059; A47B 88/08; A47B 88/10; A47B 88/49; A47B 88/493; A47B 88/407; A47B 88/0407; A47B 88/423; A47B 88/0418; A47B 88/427; A47B 88/0422; A47B 2088/4272; A47B 2088/4274
See application file for complete search history.

(56) References Cited

U.S. PATENT DOCUMENTS

| 2,542,247 A * | 2/1951 | Gussack .............. A47B 88/493 384/18 |
| 2,926,048 A * | 2/1960 | Remke .................. A47B 88/493 384/19 |

(Continued)

FOREIGN PATENT DOCUMENTS

EP 2601862 A1 * 6/2013 ............. A47B 88/14

*Primary Examiner* — Andrew M Roersma
(74) *Attorney, Agent, or Firm* — Rosenberg, Klein & Lee

(57) ABSTRACT

A slide rail assembly includes a first rail, a second rail, and a supporting member. The second rail can be displaced with respect to the first rail. The supporting member is connected to the second rail and includes an upper supporting portion and a lower supporting portion. The upper supporting portion is used for supporting an upper wall of the first rail, and the lower supporting portion, for supporting a lower wall of the first rail.

16 Claims, 6 Drawing Sheets

(51) Int. Cl.
*A47B 88/49* (2017.01)
*A47B 88/48* (2017.01)
*A47B 88/42* (2017.01)
*A47B 88/493* (2017.01)
*A47B 88/487* (2017.01)
*A47B 88/427* (2017.01)

(52) U.S. Cl.
CPC ............... *A47B 2210/0032* (2013.01); *A47B 2210/0035* (2013.01); *A47B 2210/0059* (2013.01)

(56) References Cited

U.S. PATENT DOCUMENTS

| | | | | |
|---|---|---|---|---|
| 3,059,978 A | * | 10/1962 | Fall | F16C 29/06 312/334.11 |
| 3,462,203 A | * | 8/1969 | Del Vecchio | F16C 29/00 312/334.47 |
| 4,183,596 A | * | 1/1980 | Greene | A47B 88/493 312/286 |
| 4,469,384 A | * | 9/1984 | Fler | A47B 88/493 312/333 |
| 4,712,927 A | * | 12/1987 | Arrendiell | A47B 88/49 384/23 |
| 5,466,060 A | * | 11/1995 | Hoffman | A47B 88/493 312/334.11 |
| 7,370,920 B2 | | 5/2008 | Wang et al. | |
| 7,850,369 B2 | * | 12/2010 | Young | A47B 88/493 312/334.11 |
| 8,303,183 B2 | | 11/2012 | Chen et al. | |
| 8,403,433 B2 | * | 3/2013 | Chen | A47B 88/43 312/333 |
| 9,504,181 B2 | | 11/2016 | Chen et al. | |
| 2006/0091771 A1 | * | 5/2006 | Teskey | A47B 88/49 312/334.44 |
| 2012/0128278 A1 | * | 5/2012 | Chen | A47B 88/40 384/26 |

* cited by examiner

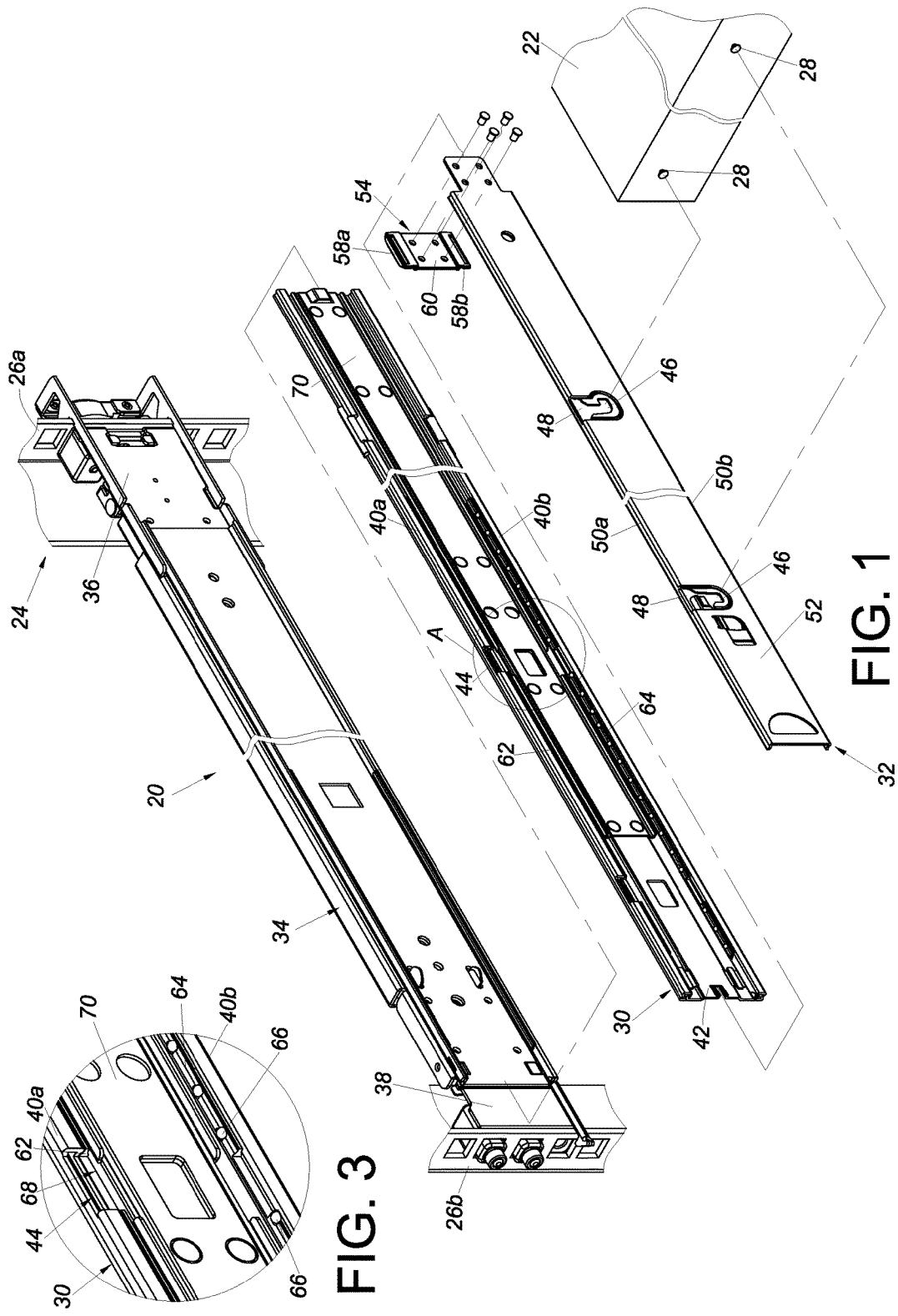

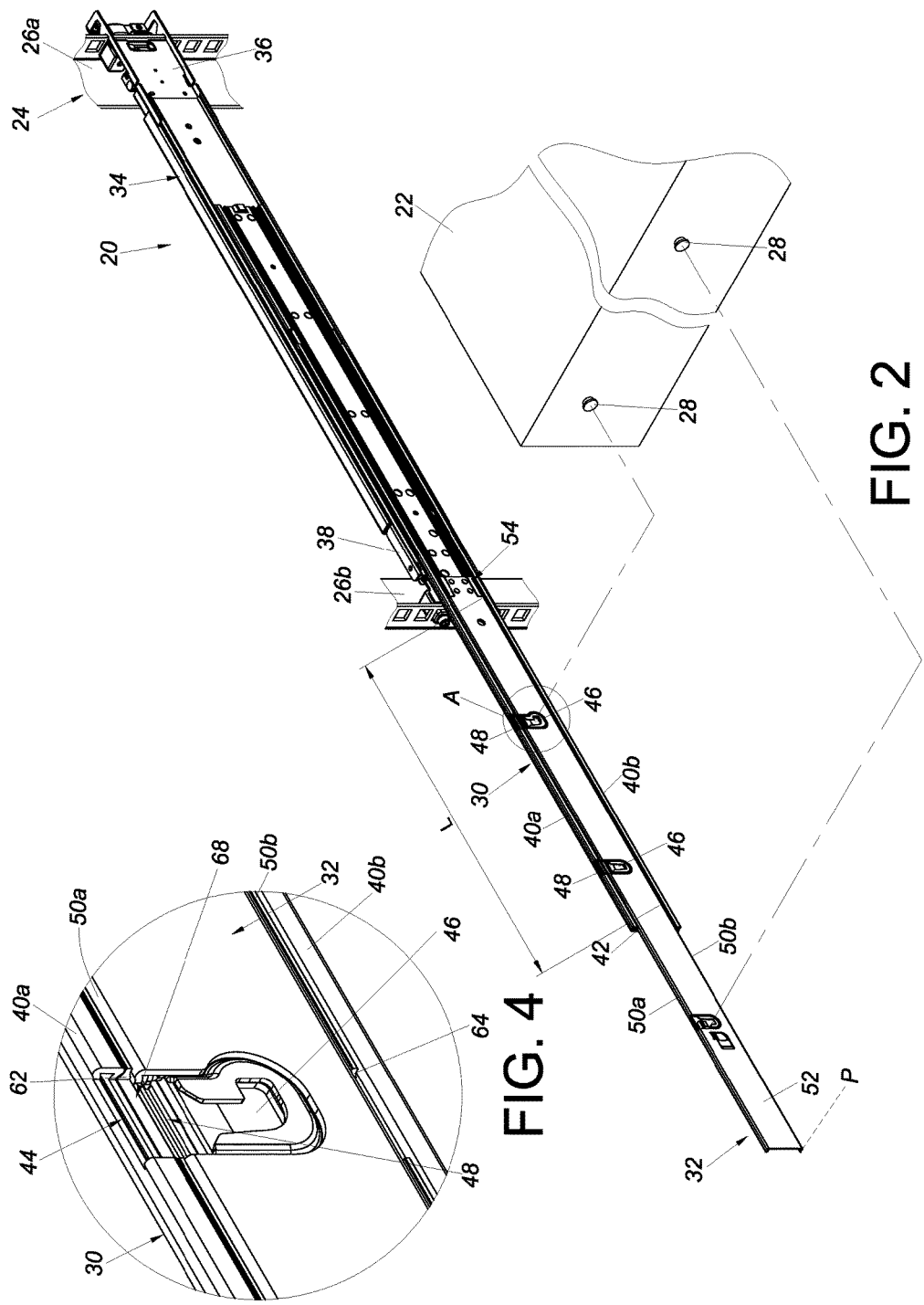

SLIDE RAIL ASSEMBLY

FIELD OF THE INVENTION

The present invention relates to a slide rail assembly and more particularly to one with a supporting mechanism between two slide rails.

BACKGROUND OF THE INVENTION

Generally speaking, the main purpose of a slide rail assembly is to enable an object mounted thereon to be displaced along with a slide rail of the assembly with respect to another slide rail of the assembly. Some slide rail assemblies nowadays include a rolling ball device provided between two slide rails to facilitate relative displacement of those slide rails.

In FIG. 2 of U.S. Pat. No. 7,370,920 B2, Wang et al. disclose a chassis member 16 extending, or displaced, beyond an end portion of an intermediate member 14, wherein the chassis member 16 is provided with a plurality of spaced-apart J-shaped apertures (not labeled in the drawing). Between the chassis member 16 and the intermediate member 14 is a bearing ball retainer 22 in which a plurality of bearing balls 24 are provided and which is shorter than the chassis member 16. According to FIG. 4 of the '920 B2 patent, the bearing ball retainer 22 corresponds in position to the J-shaped apertures of the chassis member 16. Typically, these J-shaped apertures are provided so that the standoffs on one side of a chassis can be mounted into the J-shaped apertures by a drop-in mounting method respectively. To prevent the bearing ball retainer 22 from interfering with the mounting of the chassis standoffs, the bearing ball retainer 22 not only is short but also does not extend beyond the last J-shaped aperture of the chassis member 16.

Obviously, the foregoing configuration of the '920 B2 patent hinders the bearing ball retainer 22 from supporting the chassis member 16 and the intermediate member 14. As a solution, according to FIG. 6 of the '920 B2 patent, two pairs of spaced-apart tabs 26 are provided at one end of the chassis member 16, and a supporting strip 34 or 38 is mounted between each pair of tabs 26 in order for the chassis member 16 to better support the intermediate member 14.

The aforesaid solution, however, still leaves something to be desired because it fails to increase the load bearing capacity of the slide rail assembly as a whole. The present invention was therefore developed to provide further improvement.

SUMMARY OF THE INVENTION

One objective of the present invention is to provide a slide rail assembly whose load bearing capacity is higher than those of its prior art counterparts.

According to one aspect of the present invention, a slide rail assembly includes a first rail, a second rail, and a supporting member. The first rail includes a first upper wall, a first lower wall, and a first sidewall connected between the first upper wall and the first lower wall. The second rail can be displaced with respect to the first rail. The supporting member is connected to the second rail and includes an upper supporting portion. The upper supporting portion is configured for supporting the first upper wall of the first rail.

Preferably, the second rail includes a second upper wall, a second lower wall, and a second sidewall connected between the second upper wall and the second lower wall.

Preferably, the supporting member includes a lower supporting portion and a side portion connected between the upper supporting portion and the lower supporting portion, and the lower supporting portion is configured for supporting the first lower wall of the first rail.

Preferably, the supporting member is fixedly connected to the second rail at a position adjacent to one end of the second rail.

Preferably, the slide rail assembly further includes an upper supporting strip provided between the first upper wall of the first rail and the second upper wall of the second rail to support the first rail and the second rail.

Preferably, the slide rail assembly further includes a lower supporting strip provided between the first lower wall of the first rail and the second lower wall of the second rail to support the first rail and the second rail.

Preferably, the slide rail assembly further includes a plurality of balls mounted in the upper supporting strip.

Preferably, the slide rail assembly further includes a plurality of balls mounted in the lower supporting strip.

Preferably, the first upper wall of the first rail has a first notch, the second rail has a second notch, and the upper supporting strip has a third notch. The first notch, the second notch, and the third notch correspond in position to one another when the second rail is at a predetermined position with respect to the first rail.

Preferably, the slide rail assembly further includes a reinforcing member connected to the first sidewall of the first rail.

Preferably, the reinforcing member has an upper supporting wall adjacent to the first upper wall of the first rail and a lower supporting wall adjacent to the first lower wall of the first rail, and the supporting member has a pair of grooves corresponding to the upper supporting wall and the lower supporting wall of the reinforcing member respectively.

Alternatively, the reinforcing member has an upper supporting wall adjacent to the first upper wall of the first rail and a lower supporting wall adjacent to the first lower wall of the first rail, each of the upper supporting wall and the lower supporting wall is extended with a supporting wing, and the supporting member has a pair of L-shaped supporting legs for supporting the upper supporting wall and the lower supporting wall of the reinforcing member respectively.

Preferably, the slide rail assembly is configured to be mounted with a chassis, wherein the chassis has a side on which a plurality of mounting members are arranged. When the second rail is at the predetermined position with respect to the first rail, the first notch, the second notch, and the third notch correspond in position to one another so that one of the mounting members of the chassis can be mounted in the first notch, the second notch, and the third notch.

Preferably, the second rail includes a plurality of holes.

Preferably, the upper supporting portion of the supporting member is in contact with the upper supporting strip when the second rail is at the predetermined position with respect to the first rail.

Preferably, when the second rail reaches the predetermined position with respect to the first rail, the lower supporting portion of the supporting member is in contact with the lower supporting strip.

BRIEF DESCRIPTION OF THE DRAWINGS

FIG. 1 is an exploded perspective view of the slide rail assembly in the first embodiment of the present invention, wherein the slide rail assembly is mounted on a rack and has yet to be mounted with a chassis;

FIG. 2 is an assembled perspective view of the slide rail assembly in FIG. 1, showing how the chassis is mounted to the slide rail assembly;

FIG. 3 is an enlarged view of the circled area A in FIG. 1;

FIG. 4 is an enlarged view of the circled area A in FIG. 2;

DETAILED DESCRIPTION OF THE INVENTION

Figure 5:
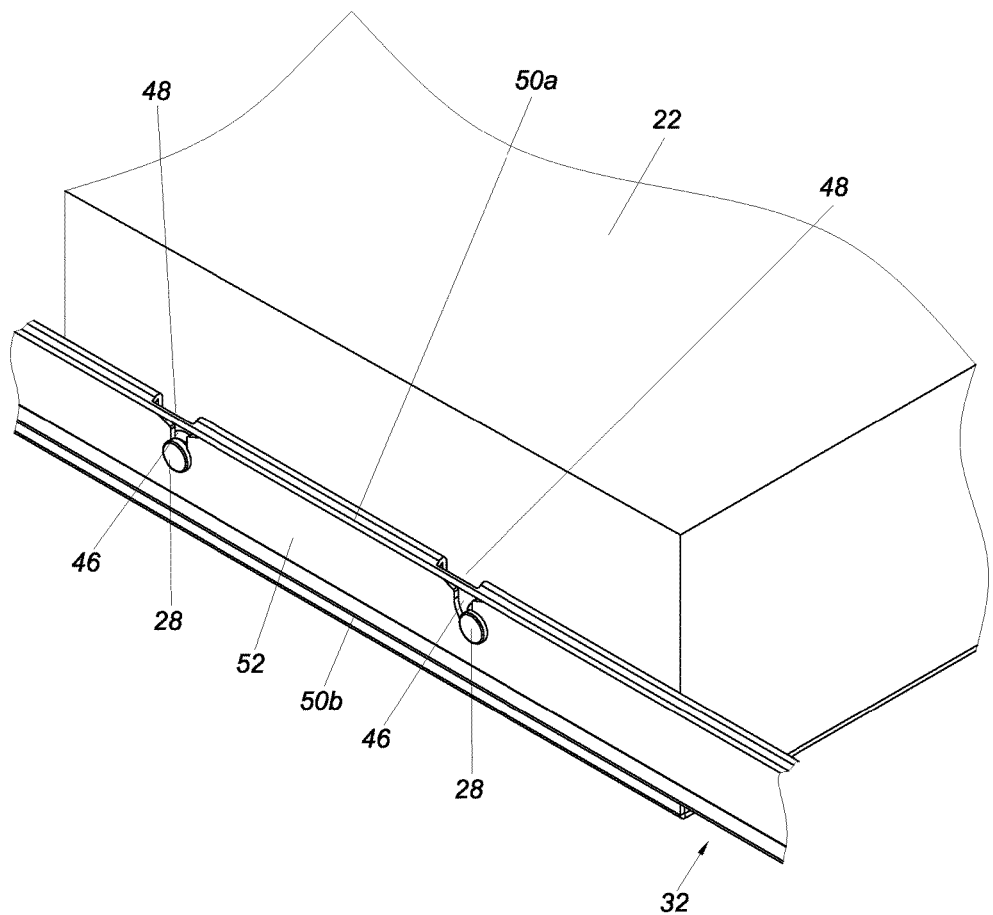
FIG. 5 is a perspective view showing the slide rail assembly in FIG. 2 mounted with the chassis.

Referring to FIG. 1 and FIG. 2, the slide rail assembly 20 in an embodiment of the present invention is configured to mount a chassis 22 to a rack 24. The rack 24 includes a plurality of posts such as a first post 26a and a second post 26b. A plurality of spaced-apart mounting members 28 are arranged on one side of the chassis 22.

The slide rail assembly 20 includes a first rail 30, a second rail 32, and preferably also a third rail 34. The third rail 34 is mounted to the first post 26a and the second post 26b via a first bracket 36 and a second bracket 38 respectively. The first rail 30 is movably mounted between the third rail 34 and the second rail 32. The first rail 30 includes a first upper wall 40a, a first lower wall 40b, and a first sidewall 42 connected between the first upper wall 40a and the first lower wall 40b. The first upper wall 40a of the first rail 30 has at least one first notch 44 (as can be seen more clearly in FIG. 3). The second rail 32 includes a second upper wall 50a, a second lower wall 50b, and a second sidewall 52 connected between the second upper wall 50a and the second lower wall 50b. The second upper wall 50a has a plurality of second notches 48, and the second sidewall 52 has a plurality of holes 46. Each second notch 48 is in communication with a corresponding one of the holes 46.

In addition, the slide rail assembly 20 includes a supporting member 54 connected to the second rail 32. The supporting member 54 includes an upper supporting portion 58a, a lower supporting portion 58b, and a side portion 60 connected between the upper supporting portion 58a and the lower supporting portion 58b. Preferably, the supporting member 54 is fixedly connected to the second rail 32 at a position adjacent to one end of the second rail 32. For instance, the supporting member 54 can be connected to the second rail 32 by riveting or threaded connection and consequently be viewed as a part of the second rail 32.

As shown in FIG. 1 and FIG. 3, the slide rail assembly 20 further includes an upper supporting strip 62 and a lower supporting strip 64, with a plurality of balls 66 mounted in the upper supporting strip 62 and/or the lower supporting strip 64. Preferably, the slide rail assembly 20 further includes a reinforcing member 70 connected to one side of the first sidewall 42 of the first rail 30. For instance, the reinforcing member 70 can be connected to the first rail 30 by riveting or threaded connection and therefore be viewed as a part of the first rail 30. Preferably, each of the reinforcing member 70 and the upper supporting strip 62 has a third notch 68.

Referring to FIG. 2 and FIG. 4, when the second rail 32 is displaced with respect to the first rail 30 to a predetermined position P, the first notches 44 correspond in position to, or are aligned with, the second notches 48 respectively, and the third notches 68 correspond in position to, or are aligned with, an aligned pair of the first and second notches, allowing the mounting members 28 on the chassis 22 to be mounted in the corresponding aligned groups of notches respectively. Moreover, each of the upper supporting strip 62 and the lower supporting strip 64 has a supporting length L that is long enough to cover two adjacent holes 46 and two adjacent second notches 48 of the second rail 32 in order to provide the first rail 30 and the second rail 32 with greater supporting ability.

In this embodiment, the slide rail assembly 20 is in an extended state when the second rail 32 is at the predetermined position P with respect to the first rail 30, and the mounting members 28 of the chassis 22 can in this state be mounted in the corresponding holes 46 of the second rail 32 respectively, as shown in FIG. 5.

Figure 6:
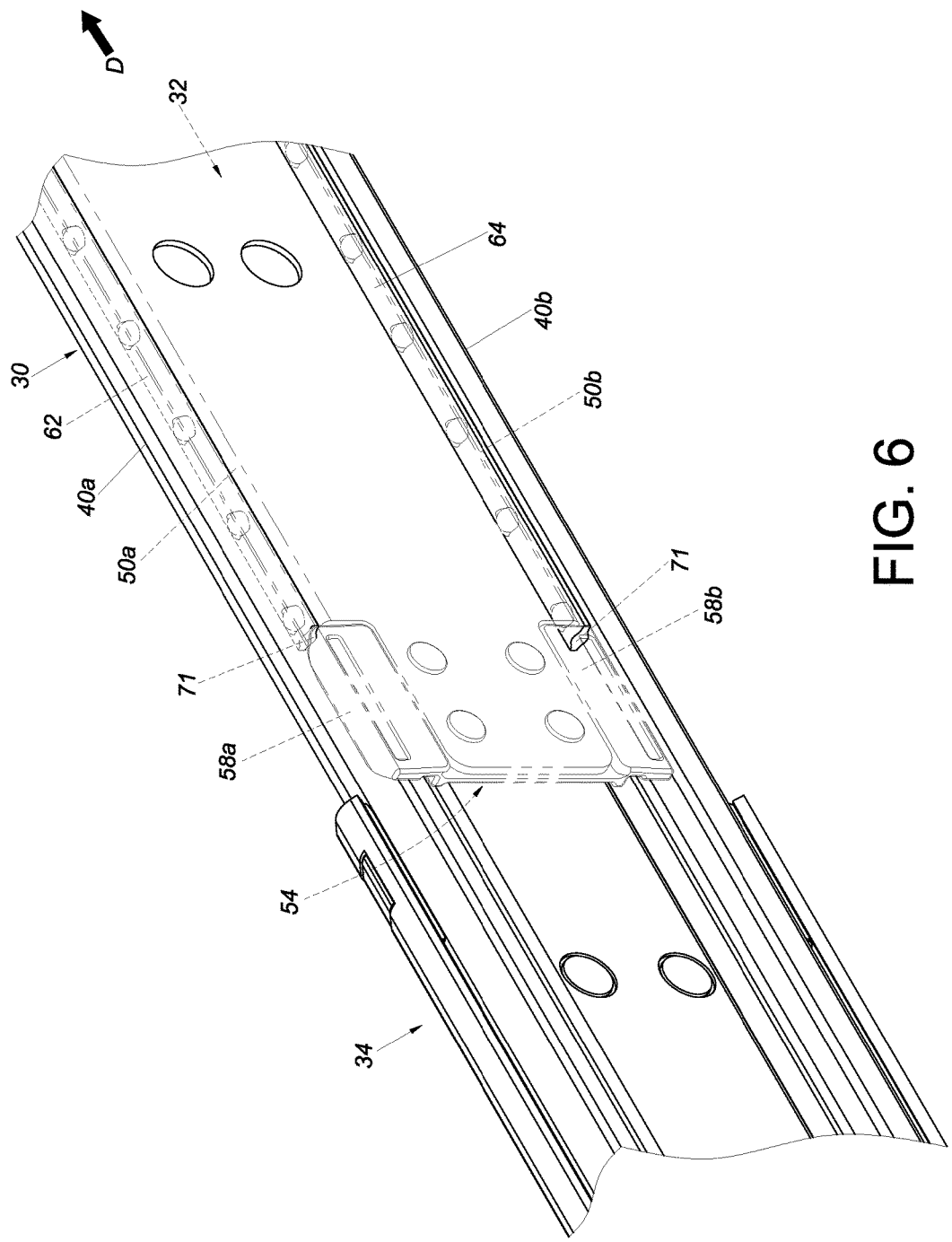
FIG. 6 is a perspective view showing how the supporting member of the slide rail assembly in the first embodiment of the present invention enables the first rail to support a predetermined portion of the second rail.

Referring to FIG. 6, the upper supporting strip 62 is provided between the first upper wall 40a of the first rail 30 and the second upper wall 50a of the second rail 32, and the lower supporting strip 64 is provided between the first lower wall 40b of the first rail 30 and the second lower wall 50b of the second rail 32. The upper supporting strip 62 and the lower supporting strip 64 serve to support the first rail 30 and the second rail 32. Furthermore, the upper supporting portion 58a and the lower supporting portion 58b of the supporting member 54 serve to support the first upper wall 40a and the first lower wall 40b of the first rail 30 respectively.

The aforesaid end of the second rail 32 is supported by the first rail 30 through the supporting member 54 such that the structural stability or reliability of the aforesaid end portion of the second rail 32 is enhanced. For instance, the supporting member 54 may fill the gap between the aforesaid end of the second rail 32 and the first rail 30. Besides, the upper supporting portion 58a and the lower supporting portion 58b of the supporting member 54 in this preferred embodiment correspond in position to an end portion 71 of the upper supporting strip 62 and an end portion 71 of the lower supporting strip 64 respectively. When the second rail 32 is displaced in a direction D with respect to the first rail 30 and the third rail 34 to a certain position (e.g., the predetermined position P), the upper supporting portion 58a and the lower supporting portion 58b of the supporting member 54 are in contact with the end portions 71 of the upper supporting strip 62 and of the lower supporting strip 64 respectively.

Figure 7:
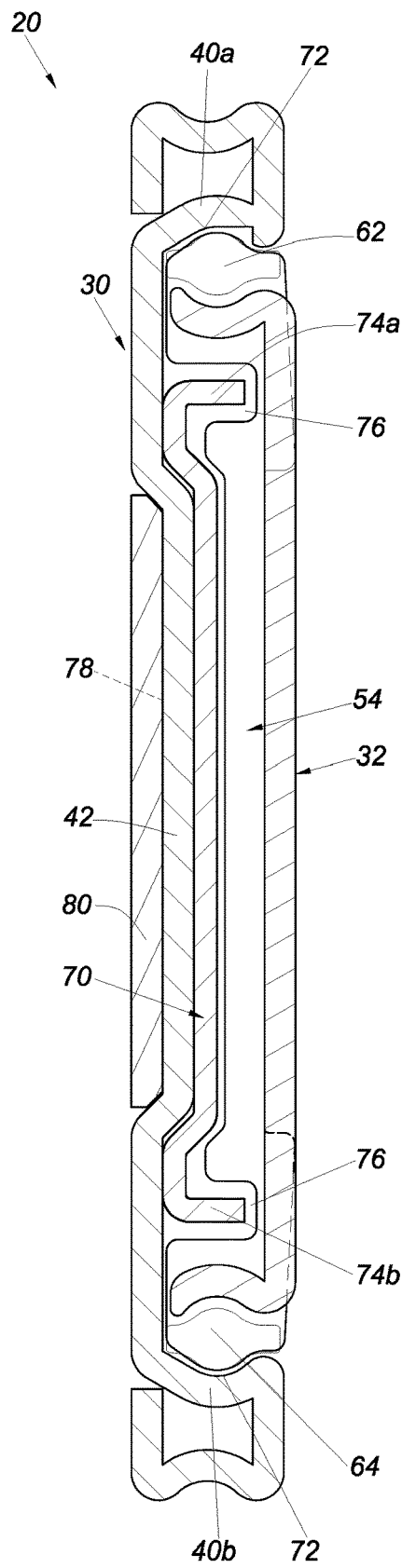
FIG. 7 is a sectional view of the slide rail assembly in the first embodiment of the present invention.

As shown in FIG. 7, each of the first upper wall 40a and the first lower wall 40b of the first rail 30 is provided with a channel 72 extending along the length of the first rail 30, and each of the upper supporting strip 62 and the lower supporting strip 64 has a contour matching a corresponding one of the channels 72.

Moreover, the reinforcing member 70, which is located on one side of the first sidewall 42 of the first rail 30, has an upper supporting wall 74a and a lower supporting wall 74b. The upper supporting wall 74a is adjacent to the first upper wall 40a of the first rail 30 while the lower supporting wall 74b is adjacent to the first lower wall 40b of the first rail 30. The supporting member 54, on the other hand, has a pair of grooves 76 corresponding respectively to the upper supporting wall 74a and the lower supporting wall 74b of the reinforcing member 70. This arrangement allows the supporting member 54 to be displaced along the length of the reinforcing member 70 when the second rail 32 is displaced with respect to the first rail 30. Preferably, the other side of the first sidewall 42 of the first rail 30 has a mounting groove 78 in which a reinforcing pad 80 is mounted. The reinforcing pad 80 helps increase the structural strength of the first rail 30 and can be connected to the first rail 30 by riveting, soldering, or threaded connection.

Figure 8:
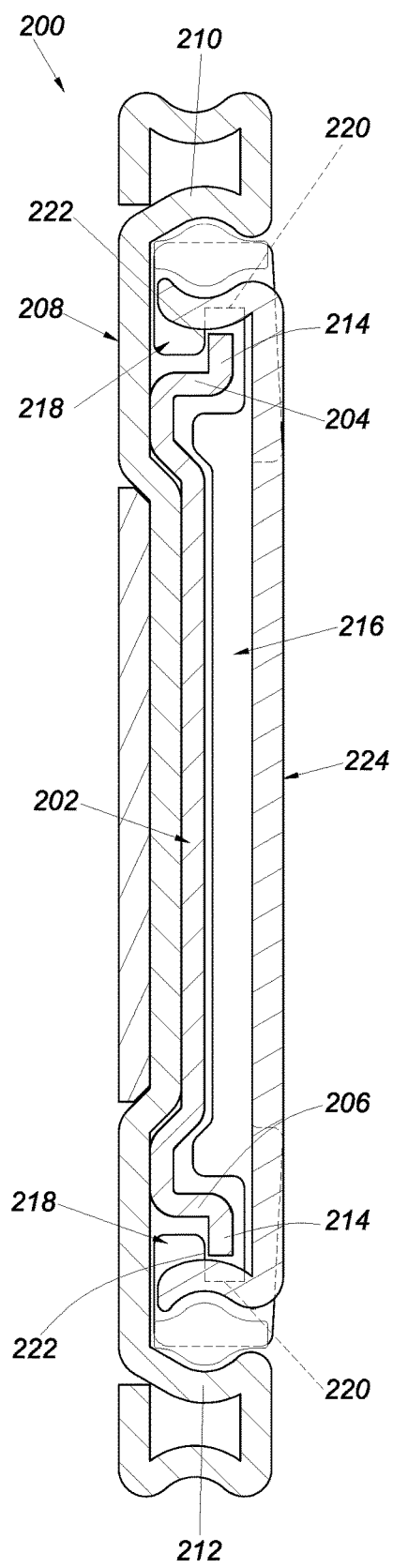
FIG. 8 is a sectional view of the slide rail assembly in the second embodiment of the present invention.

FIG. 8 shows the slide rail assembly 200 in the second embodiment of the present invention. The slide rail assembly 200 in the second embodiment is different from the foregoing slide rail assembly 20 substantially in that the reinforcing member 202 and the supporting member 216 of the slide rail assembly 200 are arranged with respect to each other differently from the reinforcing member 70 and the supporting member 54 of the slide rail assembly 20. More specifically, the reinforcing member 202 has an upper supporting wall 204 and a lower supporting wall 206. The upper supporting wall 204 is adjacent to the first upper wall 210 of the first rail 208, the lower supporting wall 206 is adjacent to the first lower wall 212 of the first rail 208, and each of the upper supporting wall 204 and the lower supporting wall 206 is extended with a supporting wing 214. The supporting member 216 has a pair of L-shaped supporting legs 218 each including, for example, a first section 220 and a second section 222 substantially perpendicularly bent with respect to the first section 220. The supporting legs 218 serve to support the supporting wings 214 of the upper supporting wall 204 and of the lower supporting wall 206 of the reinforcing member 202 respectively. This alternative arrangement not only allows the supporting member 216 to be displaced along the length of the reinforcing member 202 when the second rail 224 is displaced with respect to the first rail 208, but also provides greater support.

While the present invention has been disclosed by way of the preferred embodiments described above, it should be understood that the embodiments provided herein are not intended to be restrictive of the scope of the invention. The scope of patent protection sought by the applicant is defined by the appended claims.

What is claimed is:

1. A slide rail assembly, comprising:
   a first rail including a first upper wall, a first lower wall, and a first sidewall connected between the first upper wall and the first lower wall;
   a second rail displaceable with respect to the first rail, wherein the second rail includes a second upper wall, a second lower wall, and a second sidewall connected between the second upper wall and the second lower wall;
   a supporting member connected to the second rail, wherein the supporting member includes an upper supporting portion, a lower supporting portion, and a side portion connected between the upper supporting portion and the lower supporting portion; the upper supporting portion is configured for supporting the first upper wall of the first rail; and the lower supporting portion is configured for supporting the first lower wall of the first rail; and
   a reinforcing member connected to the first sidewall of the first rail, the reinforcing member having an upper supporting wall and a lower supporting wall, the upper supporting wall being adjacent to the first upper wall of the first rail, the lower supporting wall being adjacent to the first lower wall of the first rail, and the supporting member having a pair of grooves corresponding to the upper supporting wall and the lower supporting wall of the reinforcing member respectively.

2. The slide rail assembly of claim 1, wherein the supporting member is fixedly connected to the second rail at a position adjacent to an end of the second rail.

3. The slide rail assembly of claim 1, further comprising an upper supporting strip provided between the first upper wall of the first rail and the second upper wall of the second rail to support the first rail and the second rail.

4. The slide rail assembly of claim 3, further comprising a plurality of balls mounted in the upper supporting strip.

5. The slide rail assembly of claim 3, wherein the first upper wall of the first rail has a first notch, the second rail has a second notch, the upper supporting strip has a third notch, and when the second rail reaches a predetermined position with respect to the first rail, the first notch, the second notch, and the third notch correspond in position to one another.

6. The slide rail assembly of claim 1, further comprising a lower supporting strip provided between the first lower wall of the first rail and the second lower wall of the second rail to support the first rail and the second rail.

7. The slide rail assembly of claim 6, further comprising a plurality of balls mounted in the lower supporting strip.

8. A slide rail assembly, comprising:
   a first rail including a first upper wall, a first lower wall, and a first sidewall connected between the first upper wall and the first lower wall;
   a second rail displaceable with respect to the first rail, wherein the second rail includes a second upper wall, a second lower wall, and a second sidewall connected between the second upper wall and the second lower wall;
   a supporting member connected to the second rail, wherein the supporting member includes an upper supporting portion, a lower supporting portion, and a side portion connected between the upper supporting portion and the lower supporting portion; the upper supporting portion is configured for supporting the first upper wall of the first rail; and the lower supporting portion is configured for supporting the first lower wall of the first rail; and
   a reinforcing member connected to the first sidewall of the first rail, the reinforcing member having an upper supporting wall and a lower supporting wall, the upper supporting wall being adjacent to the first upper wall of the first rail, the lower supporting wall being adjacent to the first lower wall of the first rail, each of the upper supporting wall and the lower supporting wall being extended with a supporting wing, and the supporting member having a pair of L-shaped supporting legs for supporting the upper supporting wall and the lower supporting wall of the reinforcing member respectively.

9. A slide rail assembly configured to be mounted with a chassis, wherein the chassis has a side on which a plurality of mounting members are arranged, the slide rail assembly comprising:
   a first rail including a first upper wall, a first lower wall, and a first sidewall connected between the first upper wall and the first lower wall, wherein the first upper wall of the first rail has a first notch;
   a second rail displaceable with respect to the first rail, wherein the second rail includes a plurality of holes and has a second notch;
   an upper supporting strip provided between the first upper wall of the first rail and the second rail to support the first rail and the second rail, wherein the upper supporting strip has a third notch;

a supporting member connected to the second rail, wherein the supporting member includes an upper supporting portion, a lower supporting portion, and a side portion connected between the upper supporting portion and the lower supporting portion; the upper supporting portion is configured for supporting the first upper wall of the first rail; and the lower supporting portion is configured for supporting the first lower wall of the first rail; and a reinforcing member connected to the first sidewall of the first rail, the reinforcing member having an upper supporting wall and a lower supporting wall, the upper supporting wall being adjacent to the first upper wall of the first rail, the lower supporting wall being adjacent to the first lower wall of the first rail, and the supporting member having a pair of grooves corresponding to the upper supporting wall and the lower supporting wall of the reinforcing member respectively;

wherein when the second rail reaches a predetermined position with respect to the first rail, the first notch, the second notch, and the third notch correspond in position to one another so that one of the mounting members of the chassis is able to be mounted in the first notch, the second notch, and the third notch.

10. The slide rail assembly of claim 9, wherein the supporting member is fixedly connected to the second rail at a position adjacent to an end of the second rail.

11. The slide rail assembly of claim 9, further comprising a lower supporting strip provided between the first lower wall of the first rail and the second rail to support the first rail and the second rail.

12. The slide rail assembly of claim 11, further comprising a plurality of balls mounted in the lower supporting strip.

13. The slide rail assembly of claim 9, further comprising a plurality of balls mounted in the upper supporting strip.

14. A slide rail assembly configured to be mounted with a chassis, wherein the chassis has a side on which a plurality of mounting members are arranged, the slide rail assembly comprising:

a first rail including a first upper wall, a first lower wall, and a first sidewall connected between the first upper wall and the first lower wall, wherein the first upper wall of the first rail has a first notch;

a second rail displaceable with respect to the first rail, wherein the second rail includes a plurality of holes and has a second notch;

an upper supporting strip provided between the first upper wall of the first rail and the second rail to support the first rail and the second rail, wherein the upper supporting strip has a third notch;

a supporting member connected to the second rail, wherein the supporting member includes an upper supporting portion, a lower supporting portion, and a side portion connected between the upper supporting portion and the lower supporting portion; the upper supporting portion is configured for supporting the first upper wall of the first rail; and the lower supporting portion is configured for supporting the first lower wall of the first rail; and a reinforcing member connected to the first sidewall of the first rail, the reinforcing member having an upper supporting wall and a lower supporting wall, the upper supporting wall being adjacent to the first upper wall of the first rail, the lower supporting wall being adjacent to the first lower wall of the first rail, each of the upper supporting wall and the lower supporting wall being extended with a supporting wing, and the supporting member having a pair of L-shaped supporting legs for supporting the upper supporting wall and the lower supporting wall of the reinforcing member respectively;

wherein when the second rail reaches a predetermined position with respect to the first rail, the first notch, the second notch, and the third notch correspond in position to one another so that one of the mounting members of the chassis is able to be mounted in the first notch, the second notch, and the third notch.

15. A slide rail assembly, comprising:

a first rail including a first upper wall, a first lower wall, and a first sidewall connected between the first upper wall and the first lower wall;

a second rail displaceable with respect to the first rail, wherein the second rail includes a second upper wall, a second lower wall, and a second sidewall connected between the second upper wall and the second lower wall;

a supporting member connected to the second rail, wherein the supporting member includes an upper supporting portion for supporting the first upper wall of the first rail;

a reinforcing member connected to the first sidewall of the first rail the reinforcing member having an upper supporting wall and a lower supporting wall, the upper supporting wall being adjacent to the first upper wall of the first rail, the lower supporting wall being adjacent to the first lower wall of the first rail, and the supporting member having a pair of grooves corresponding to the upper supporting wall and the lower supporting wall of the reinforcing member respectively, and an upper supporting strip provided between the first upper wall of the first rail and the second upper wall of the second rail;

wherein when the second rail reaches a predetermined position with respect to the first rail, the upper supporting portion of the supporting member is in contact with the upper supporting strip.

16. The slide rail assembly of claim 15, wherein the supporting member is fixedly connected to the second rail at a position adjacent to an end of the second rail, the supporting member further includes a lower supporting portion for supporting the first lower wall of the first rail, the slide rail assembly further comprises a lower supporting strip provided between the first lower wall of the first rail and the second lower wall of the second rail, and when the second rail reaches the predetermined position with respect to the first rail, the lower supporting portion of the supporting member is in contact with the lower supporting strip.

* * * * *